United States Patent
Kim et al.

(10) Patent No.: US 9,224,764 B2
(45) Date of Patent: Dec. 29, 2015

(54) DISPLAY SUBSTRATES, METHODS OF MANUFACTURING THE SAME AND DISPLAY DEVICES INCLUDING THE SAME

(71) Applicant: Samsung Display Co., LTD., Yongin, Gyeonggi-Do (KR)

(72) Inventors: Jae-Neung Kim, Seoul (KR); Yu-Gwang Jeong, Anyang-si (KR); Shin-Il Choi, Hwaseong-si (KR); Dae-Ho Kim, Daegu (KR); Myoung-Geun Cha, Seoul (KR); Sang-Gab Kim, Seoul (KR); Jung-Ha Son, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/468,633

(22) Filed: Aug. 26, 2014

(65) Prior Publication Data

US 2015/0162363 A1   Jun. 11, 2015

(30) Foreign Application Priority Data

Dec. 5, 2013 (KR) .......................... 10-2013-0150347

(51) Int. Cl.
*H01L 27/14* (2006.01)
*H01L 27/12* (2006.01)

(52) U.S. Cl.
CPC ........ *H01L 27/1262* (2013.01); *H01L 27/1218* (2013.01)

(58) Field of Classification Search
CPC ............ H01L 27/1214; H01L 27/1262; H01L 27/1218
USPC ......................................................... 257/72
See application file for complete search history.

(56) References Cited

U.S. PATENT DOCUMENTS

| 6,204,520 | B1 | 3/2001 | Ha et al. |
| 6,300,174 | B1 | 10/2001 | Bae |
| 8,310,612 | B2 | 11/2012 | Cho |
| 2002/0044228 | A1 | 4/2002 | Oh et al. |
| 2012/0001167 | A1 | 1/2012 | Morosawa et al. |
| 2012/0276694 | A1 | 11/2012 | Koezuka et al. |
| 2013/0256652 | A1 | 10/2013 | Lee et al. |
| 2014/0138671 | A1 | 5/2014 | Lee et al. |
| 2014/0145177 | A1 | 5/2014 | Lee et al. |

FOREIGN PATENT DOCUMENTS

| KR | 1020030021793 A | 3/2003 |
| KR | 1020040104980 A | 12/2004 |
| KR | 1020050003249 A | 1/2005 |
| KR | 1020050045126 A | 5/2005 |
| KR | 1020080062957 A | 7/2008 |
| KR | 1020120003803 A | 1/2012 |
| KR | 1020120121846 A | 11/2012 |
| KR | 101277221 B1 | 6/2013 |
| KR | 1020130111872 A | 10/2013 |
| KR | 1020130112778 A | 10/2013 |
| KR | 1020140064040 A | 5/2014 |
| KR | 1020140066524 A | 6/2014 |
| KR | 1020150033155 A | 4/2015 |

*Primary Examiner* — Douglas Menz
(74) *Attorney, Agent, or Firm* — Cantor Colburn LLP

(57) ABSTRACT

A display substrate includes a data pad on a base substrate, a first buffer layer which covers the data pad, a second buffer layer pattern which is disposed on the first buffer layer and separated from the data pad in a plan view, an active layer on the second buffer layer pattern, a gate insulation layer pattern on the active layer, both ends of the active layer exposed by the gate insulation layer pattern, and a gate electrode on the gate insulation layer pattern.

7 Claims, 10 Drawing Sheets

DISPLAY SUBSTRATES, METHODS OF MANUFACTURING THE SAME AND DISPLAY DEVICES INCLUDING THE SAME

This application claims priority to Korean Patent Application No. 10-2013-0150347 filed on Dec. 5, 2013, and all the benefits accruing therefrom under 35 U.S.C. §119, the entire disclosure of which is incorporated by reference herein.

BACKGROUND

1. Field

Exemplary embodiments relate to display substrates, methods of manufacturing the same and display devices including the same. More particularly, exemplary embodiments relate to top-gate type display substrates, methods of manufacturing the same and display devices including the same.

2. Description of the Related Art

A display device including an organic light emitting display ("OLED") device or a liquid crystal display ("LCD") device, for example, may include a light emitting structure having an organic light emitting layer or a liquid crystal layer on a display substrate.

The display substrate may include a switching device such as a thin film transistor ("TFT") and a wiring structure such as a data line and a gate line. In a top-gate type TFT, a gate electrode may be disposed on an active layer, and an insulation layer may be disposed between the gate electrode and the active layer. The insulation layer may be etched to form a contact electrically connected to the active layer.

SUMMARY

When an insulation layer is etched, an active layer may be damaged during an etching process for the insulation layer.

Exemplary embodiments provide a display substrate having excellent electrical properties and high reliability.

Exemplary embodiments provide a method of manufacturing a display substrate having excellent electrical properties and high reliability.

Exemplary embodiments provide a display device including a display substrate having excellent electrical properties and high reliability.

According to exemplary embodiments, there is provided a display substrate. The display substrate includes a data pad, a first buffer layer, a second buffer layer pattern, an active layer, a gate insulation layer pattern and a gate electrode. The data pad is disposed on a base substrate. The first buffer layer covers the data pad. The second buffer layer pattern is disposed on the first buffer layer. The second buffer layer pattern is separated from the data pad in a plan view. The active layer is disposed on the second buffer layer pattern. A gate insulation layer pattern is disposed on the active layer. Both ends of the active layer are exposed by the gate insulation layer pattern. The gate electrode is disposed on the gate insulation layer pattern.

In exemplary embodiments, the first buffer layer may include silicon nitride and the second buffer layer pattern may include silicon oxide.

In exemplary embodiments, the gate insulation layer pattern may include silicon oxide.

In exemplary embodiments, the gate insulation layer pattern may include a first gate insulation layer pattern portion including silicon oxide and a second gate insulation layer pattern portion including silicon nitride on the first gate insulation layer pattern portion.

In exemplary embodiments, lateral surfaces of the active layer and the second buffer layer pattern may be extended in the same plane.

In exemplary embodiments, the display substrate may further include a passivation layer, a drain contact and a data contact. The passivation layer may cover the first buffer layer, the second buffer layer pattern, the active layer, the gate insulation layer pattern and the gate electrode. The drain contact may be extended through the passivation layer to be electrically connected to one end of the active layer. The data contact may be provided through the passivation layer and the first buffer layer to be electrically connected to the data pad.

In exemplary embodiments, the display substrate may further include a connection electrode which is unitary with the drain contact and the data contact.

According to exemplary embodiments, there is provided a method of manufacturing a display substrate. In the method, a data pad is disposed on a base substrate. A first buffer layer and a second buffer layer are sequentially disposed on the base substrate to cover the data pad. An active layer is disposed on the second buffer layer. A gate insulation layer is disposed on the second buffer layer to cover the active layer. A gate electrode is disposed on the gate insulation layer. The gate insulation layer is partially etched using the gate electrode as an etching mask to provide a gate insulation layer pattern. Both ends of the active layer are exposed by the gate insulation layer pattern. The second buffer layer is partially etched to provide a second buffer layer pattern such that a portion of the second buffer layer overlapping with the data pad is removed.

In exemplary embodiments, the first buffer layer and the second buffer layer may be provided using silicon nitride and silicon oxide, respectively.

In exemplary embodiments, the active layer may serve as an etching mask in partially etching the second buffer layer.

In exemplary embodiments, in partially etching the gate insulation layer, an upper portion of the gate insulation layer may be removed by a first etching process to provide a preliminary gate insulation layer pattern that covers the active layer. The preliminary gate insulation layer pattern may be partially removed by a second etching process to provide the gate insulation layer pattern.

In exemplary embodiments, an etching rate of the second etching process may be lower than that of the first etching process.

In exemplary embodiments, nitrogen fluoride and carbon fluoride may be used as an etching gas for the first etching process and the second etching process, respectively.

In exemplary embodiments, the gate insulation layer may be provided using silicon oxide. The second buffer layer may be partially etched by the second etching process to provide the second buffer layer pattern.

In exemplary embodiments, in providing the gate insulation layer, a first gate insulation layer may be provided using silicon oxide. A second gate insulation layer may be provided using silicon nitride on the first gate insulation layer. A second gate insulation layer pattern portion may be provided by the first etching process and a first gate insulation layer pattern portion may be provided by the second etching process.

In exemplary embodiments, a passivation layer that covers the first buffer layer, the second buffer layer pattern, the active layer, the gate insulation layer pattern and the gate electrode may be provided. A drain contact may be provided through the passivation layer and a data contact may be provided through the passivation layer and the first buffer layer. The drain contact may be electrically connected to one end of the active layer, and the data contact may be electrically connected to the data pad.

In exemplary embodiments, a connection electrode connecting the drain contact and the data contact to each other may be unitary with the drain contact and the data contact.

In exemplary embodiments, the passivation layer may contact the both ends of the active layer such that the both ends of the active layer may be transformed into a source region and a drain region. The drain contact may be electrically connected to the drain region.

According to exemplary embodiments, there is provided a display device. The display device includes a data pad on a base substrate, a first buffer layer covering the data pad, a second buffer layer pattern separated from the data pad on the first buffer layer in a plan view, a thin film transistor ("TFT") on the second buffer layer pattern, a passivation layer covering the TFT and the first buffer layer, a pixel electrode electrically connected to the TFT and the data pad, a light emitting layer on the pixel electrode, and an opposing electrode on the light emitting layer.

In exemplary embodiments, the TFT may include an active layer on the second buffer layer pattern, a gate insulation layer pattern on the active layer, both ends of which are exposed by the gate insulation layer pattern, and a gate electrode on the gate insulation layer pattern. The pixel electrode may be electrically connected to a drain contact and a data contact. The drain contact may be electrically connected to one end of the active layer through the passivation layer, and the data contact may be electrically connected to the data pad through the passivation layer and the first buffer layer.

According to exemplary embodiments, a gate insulation layer may be etched using a gate electrode as an etching mask to expose a peripheral portion of an active layer. The etching process for the gate insulation layer may include two processes to prevent a damage of the active layer. Additionally, a buffer layer disposed under the active layer and covering a data pad may also be partially etched together with the gate insulation layer. Therefore, when contact structures electrically connected to the peripheral portion of the active layer and the data pad are provided, a thickness of a layer structure disposed on the data pad may be decreased so that an etching amount for providing the contact structure may be effectively reduced. Accordingly, an etching damage occurring at a portion of the active layer in contact with the contact structure may be effectively prevented.

BRIEF DESCRIPTION OF THE DRAWINGS

Exemplary embodiments will be more clearly understood from the following detailed description taken in conjunction with the accompanying drawings.

FIG. 1 is a cross-sectional view illustrating exemplary embodiments of a display substrate in accordance with the invention;

FIG. 2 is a cross-sectional view illustrating exemplary embodiments a display substrate in accordance with the invention;

FIGS. 3 to 12 are cross-sectional views illustrating exemplary embodiments of a method of manufacturing a display substrate in accordance with the invention;

FIGS. 13 to 18 are cross-sectional views illustrating exemplary embodiments of a method of manufacturing a display substrate in accordance with the invention; and FIG. 19 is a cross-sectional view illustrating exemplary embodiments of a display device in accordance with the invention.

DETAILED DESCRIPTION

Figure 1:
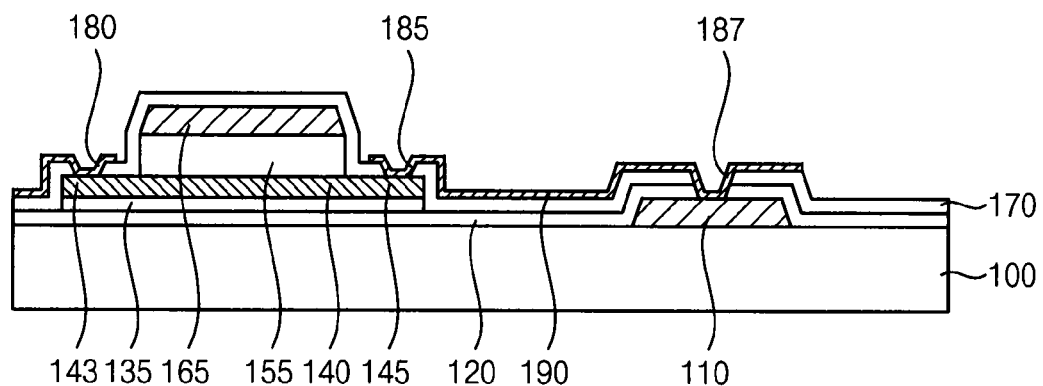
FIGS. 1 to 19 represent non-limiting exemplary embodiments as described herein.

Various exemplary embodiments will be described more fully hereinafter with reference to the accompanying drawings, in which exemplary embodiments are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity. Like numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that, although the terms first, second, third etc. may be used herein to describe various elements, these elements should not be limited by these terms. These terms are used to distinguish one element from another. Thus, a first element discussed below could be termed a second element without departing from the teachings of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a display substrate in accordance with exemplary embodiments. In an exemplary embodiment, the display substrate of FIG. 1 may include a top-gate type thin film transistor ("TFT").

Referring to FIG. 1, the display substrate may include a data pad 110, a first buffer layer 120, a second buffer layer pattern 135, an active layer 140, a gate insulation layer pattern 155, a gate electrode 165, a passivation layer 170, a source contact 180, a drain contact 185, a data contact 187 and a connection electrode 190 disposed on a base substrate 100. The TFT of the display substrate may be defined by the active layer 140, a gate insulation layer pattern 155 and the gate electrode 165.

The base substrate 100 may include a transparent insulation substrate. In an exemplary embodiment, the base substrate 100 may include a glass substrate, a transparent plastic substrate, a transparent metal oxide substrate, etc. In an exemplary embodiment, the transparent plastic substrate may include, e.g., polyethylene terephthalate ("PET"), polyethylene naphthalate ("PEN") or polyimide, for example.

The data pad 110 may be disposed on the base substrate 100. The data pad 110 may include a metal, an alloy or a metal nitride. In an exemplary embodiment, the data pad 110 may include the metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc), an alloy thereof or a nitride thereof, for example. The above described elements may be used alone or in any combinations thereof. In an alternative exemplary embodiment, the data pad 110 may include a transparent conductive material, e.g., indium tin oxide ("ITO"), indium zinc oxide ("IZO") or aluminum doped zinc oxide ("AZO"). The data pad 110 may have a multi-layered structure including at least two materials among the metal, the alloy, the metal nitride and the transparent conductive material. In an exemplary embodiment, the data pad 110 may have a double-layered structure including aluminum and molybdenum (Al/Mo) layers or titanium and copper (Ti/Cu) layers, for example, to reduce a resistance.

The first buffer layer 120 may be disposed on the base substrate 100 to cover the data pad 110. In an exemplary embodiment, the first buffer layer 120 may be disposed on a substantially entire face of the base substrate 100 to wholly cover the data pad 110.

In exemplary embodiments, the first buffer layer 120 may include silicon nitride. The first buffer layer 120 may prevent moistures or impurities from being diffused between the base substrate 100 and structures disposed thereon. A planarity of the base substrate 100 may also be enhanced by the first buffer layer 120.

The second buffer layer pattern 135 may be disposed on the first buffer layer 120. The second buffer layer pattern 135 may be located only on a switching device region at which the TFT is provided, and may not cover the data pad 110. In exemplary embodiments, the second buffer layer pattern 135 may include silicon oxide.

The active layer 140 may be disposed on the second buffer layer pattern 135. The active layer 140 may include a source region 143 and a drain region 145 at both end portions thereof. A portion between the source region 143 and the drain region 145 of the active layer 140 may be defined as a channel region. In exemplary embodiments, lateral surfaces of the active layer 140 and the second buffer layer pattern 135 may be extended in the same plane. In an exemplary embodiment, the active layer 140 and the second buffer layer pattern 135 may share a substantially common etching surface, for example.

In exemplary embodiments, the active layer 140 may include an oxide semiconductor. The oxide semiconductor may include, e.g., indium gallium zinc oxide ("IGZO"), zinc tin oxide ("ZTO") or indium tin zinc oxide ("ITZO"). When the active layer 140 directly contacts the first buffer layer 120 including silicon nitride, oxygen atoms or oxygen ions included in the active layer 140 may be diffused into the first buffer layer 120 to create oxygen vacancies in the active layer 140. In this case, electrical characteristics of the active layer 140 may be changed to deteriorate semiconductor characteristics of the active layer 140. However, according to exemplary embodiments, the second buffer layer pattern 135 may be disposed between the active layer 140 and the first buffer layer 120 to block the diffusion of the oxygen atoms or the oxygen ions.

In one exemplary embodiment, the active layer 140 may include polysilicon or amorphous silicon. In this case, the source and drain regions 143 and 145 may further include p-type impurities such as boron (B) or gallium (Ga) or n-type impurities such as phosphorous (P) or arsenic (As), for example.

The gate insulation layer pattern 155 may be disposed on the channel region of the active layer 140. Portions of the active layer 140 not covered by the gate insulation layer pattern 155 may include the source region 143 and the drain region 145.

In exemplary embodiments, the gate insulation layer pattern 155 may include silicon oxide.

The gate electrode 165 may be disposed on the gate insulation layer pattern 155. In an exemplary embodiment, the gate electrode 165 may include a metal such as Al, Ag, W, Cu, Ni, Cr, Mo, Ti, Pt, Ta, Nd and Sc, an alloy thereof or a nitride thereof, for example. The above described elements may be used alone or in any combinations thereof. In an exemplary embodiment, the gate electrode 165 may have a multi-layered structure including at least two materials among the metal, the alloy and the metal nitride. In the exemplary embodiment, the gate electrode 165 may have a double-layered structure including Al/Mo layers or Ti/Cu layers, for example. The gate electrode 165 may diverge from a gate line (not illustrated) of the display substrate. In this case, the gate electrode 165 may be integrally provided with the gate line.

In exemplary embodiments, the gate electrode 165 and the gate insulation layer pattern 155 may share a substantially common etching surface. As illustrated in FIG. 1, in the case that the gate electrode 165 has a substantially trapezoidal cross-section, an edge of a bottom surface of the gate electrode 165 and an edge of a top surface of the gate insulation layer pattern 155 may meet each other. In the case that the gate electrode 165 has a substantially rectangular cross-section, lateral surfaces of the gate electrode 165 and the gate insulation layer pattern 155 may be substantially extended in the same plane.

The passivation layer 170 may cover the first buffer layer 120, the second buffer layer pattern 135, the active layer 140, the gate insulation layer pattern 155 and the gate electrode 165. In an exemplary embodiment, the passivation layer 170 may be provided conformably along surfaces of the structures disposed on the base substrate 100 with a thin thickness. In exemplary embodiments, the passivation layer 170 may include silicon nitride.

The source contact 180 and the drain contact 185 may extend through the passivation layer 170 to contact the source region 143 and the drain region 145, respectively. The source and drain contacts 180 and 185 may be self-aligned with the gate insulation layer pattern 155 and the passivation layer 170.

In an exemplary embodiment, the source and drain contacts 180 and 185 may include a metal such as Al, Ag, W, Cu, Ni, Cr, Mo, Ti, Pt, Ta, Nd and Sc, an alloy thereof or a nitride thereof, for example. The above described elements may be used alone or in any combinations thereof. In an exemplary embodiment, the source and drain contacts 180 and 185 may have a multi-stacked structure including at least two metal layers.

In one exemplary embodiment, the source contact 180 may diverge from a source line or a gate line of the display substrate. In this case, the source contact 180 may be integrally provided with the source line or the data line.

The data contact 187 may extend through the first buffer layer 120 and the passivation layer 170 covering the data pad 110 to be electrically connected to the data pad 110. In exemplary embodiments, the data contact 187 may include a conductive material substantially the same as those of the source contact 180 and the drain contact 185.

A connection electrode 190 may connect the data contact 187 and the drain contact 185 to each other. In exemplary embodiments, the connection electrode 190 may be integrally provided with the data contact 187 and the drain contact 185, such that the data contact 187, the connection electrode 190 and the drain contact 185 form a single, unitary, indivisible member. In this case, the connection electrode 190 may include a conductive material substantially the same as those of the data contact 187 and the drain contact 185, and may be in a same layer as that of the data contact 187 and the drain contact 185. The connection electrode 190 may serve as a pixel electrode when the connection electrode 190 is implemented in a display device, e.g., an organic light emitting display ("OLED") device.

Figure 2:
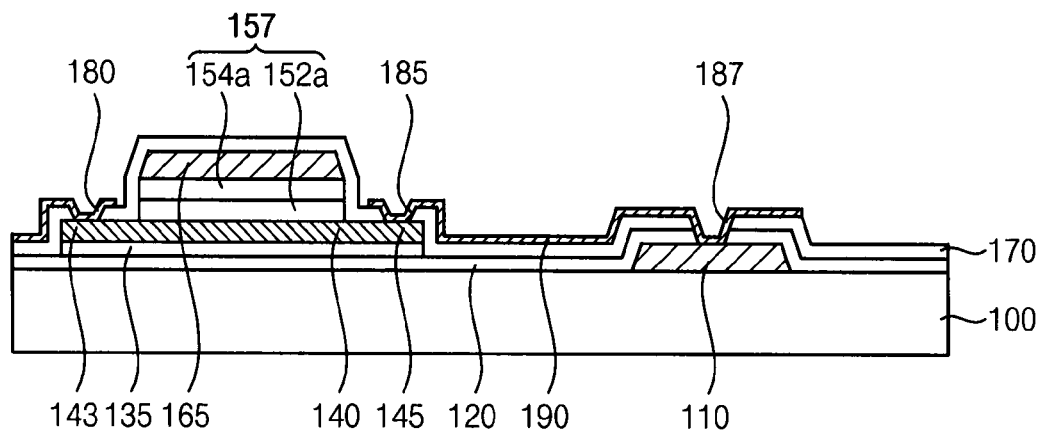

FIG. 2 is a cross-sectional view illustrating a display substrate in accordance with exemplary embodiments. The display substrate may have a structure and/or a construction substantially the same as or similar to those illustrated with reference to FIG. 1 except for a structure of a gate insulation layer pattern. Thus, detailed descriptions on elements substantially the same as or similar to those illustrated in FIG. 1 are omitted. Like reference numerals are used to indicate like elements.

Referring to FIG. 2, a gate insulation layer pattern 157 may include a first gate insulation layer pattern portion 152a and a second gate insulation layer pattern portion 154a. In exemplary embodiments, the first gate insulation layer pattern portion 152a may include silicon oxide and the second gate insulation layer pattern portion 154a may include silicon nitride.

The gate electrode 165, the first gate insulation layer pattern portion 152a and the second gate insulation layer pattern portion 154a may share a substantially common etching surface. When the gate electrode 165 has a substantially trapezoidal cross-section as illustrated in FIG. 2, an edge of a bottom surface of the gate electrode 165 and an edge of a top surface of the second gate insulation layer pattern portion 154a may meet each other. When the gate electrode 165 has a substantially rectangular cross-section, lateral surfaces of the gate electrode 165, the first gate insulation layer pattern portion 152a and the second gate insulation layer pattern portion 154a may be substantially extended in the same plane.

As illustrated in FIG. 2, the gate insulation pattern 157 may be provided as a multi-layered structure including silicon oxide and silicon nitride so that electrical characteristics of the TFT in relation to a threshold voltage of the TFT may be enhanced.

FIGS. 3 to 12 are cross-sectional views illustrating a method of manufacturing a display substrate in accordance with exemplary embodiments. In an exemplary embodiment, FIGS. 3 to 12 illustrate a method of manufacturing the display substrate of FIG. 1.

Figure 3:
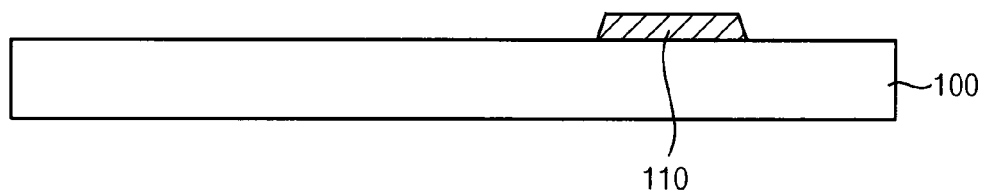

Referring to FIG. 3, a data pad 110 may be disposed on a base substrate 100. In an exemplary embodiment, a glass substrate, a transparent plastic substrate including PET, PEN or polyimide, or a transparent metal oxide substrate may be utilized as the base substrate 100.

A first conductive layer may be disposed on the base substrate 100, and then the first conductive layer may be patterned to provide the data pad 110. In an exemplary embodiment, the first conductive layer may be provided using a metal such as Al, Ag, W, Cu, Ni, Cr, Mo, Ti, Pt, Ta, Nd and Sc, a nitride thereof or an alloy thereof, for example. The above described elements may be used alone or in any combinations thereof. In an alternative exemplary embodiment, the first conductive layer may be provided using a transparent conductive material, e.g., ITO, IZO or AZO. The first conductive layer may be provided as a multi-layered structure including, e.g., Al/Mo layers or Ti/Cu layers to have a reduced resistance. In an exemplary embodiment the first conductive layer may be obtained by, e.g., a sputtering process, a printing process, an atomic layer deposition ("ALD") process, a pulse laser deposition ("PLD") process or a vacuum evaporation process, for example.

The patterning process for the first conductive layer may include a dry etching process or a wet etching process in which an etching solution including, e.g. hydrogen peroxide ($H_2O_2$) is used.

Figure 4:
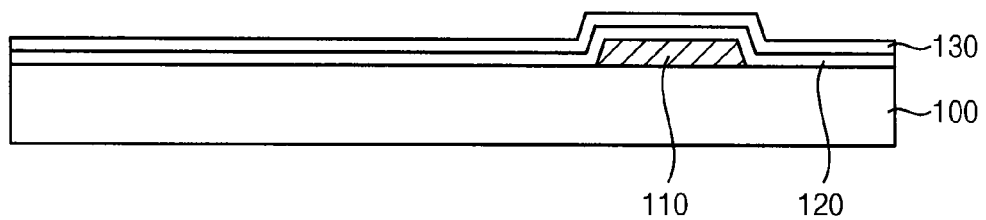

Referring to FIG. 4, a first buffer layer 120 and a second buffer layer 130 covering the data pad 110 may be disposed on the base substrate 100.

The buffer layers may prevent moistures or impurities from being diffused between the base substrate 100 and structures disposed thereon. In exemplary embodiments, the first buffer layer 120 may be provided using silicon nitride, and the second buffer layer 130 may be provided using silicon oxide.

In the case that a buffer layer including silicon oxide directly contacts the data pad 110 including, e.g., the metal, the data pad 110 may be oxidized. In a case that a buffer layer including silicon nitride directly contacts an active layer 140 (refer to FIG. 5), oxygen atoms or oxygen ions included in the active layer 140 may be transferred to the buffer layer to cause a reduction of semiconductor characteristics of the active layer 140. Thus, according to exemplary embodiments, the first buffer layer 120 including silicon nitride may be provided to cover the data pad 110, and then the second buffer layer 130 including silicon oxide may be disposed on the first buffer layer 120 so that the above-mentioned problem may be resolved.

In an exemplary embodiment, the first and second buffer layers 120 and 130 may be obtained by, e.g., a chemical vapor deposition ("CVD") process, a plasma enhanced chemical vapor deposition ("PECVD") process, a high density plasma-chemical vapor deposition ("HDP-CVD") process, a thermal deposition process or a spin coating process, for example.

The first and second buffer layers 120 and 130 may include stepped portions according to a shape of the data pad 110.

Figure 5:
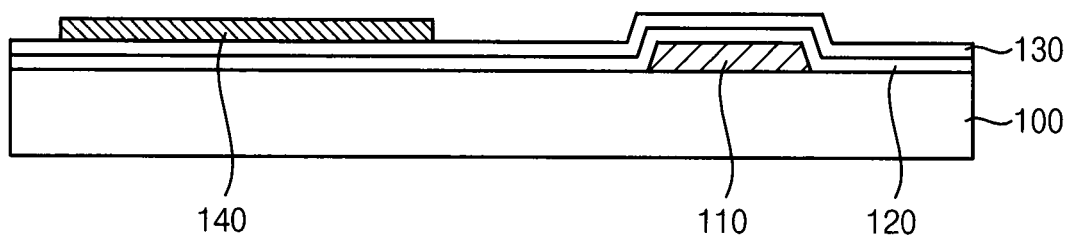

Referring to FIG. 5, the active layer 140 may be disposed on the second buffer layer 130. In an exemplary embodiment, a semiconductor material layer may be disposed on the second buffer layer 130, and then the semiconductor material layer may be patterned by, e.g., a photolithography process, to provide the active layer 140, for example.

The semiconductor material layer may be provided using an oxide semiconductor. In an exemplary embodiment, the oxide semiconductor may include, e.g., IGZO, ZTO or ITZO. In one exemplary embodiment, the semiconductor material layer may be provided using polysilicon or amorphous silicon. In an exemplary embodiment, the semiconductor material layer may be obtained by a sputtering process, a CVD process, a low pressure chemical vapor deposition ("LPCVD"), a vacuum evaporation process, etc. In the case that the semiconductor material layer includes polysilicon or amorphous silicon, a laser crystallization process or a thermal crystallization process may be further performed to crystallize the semiconductor material layer.

Figure 6:
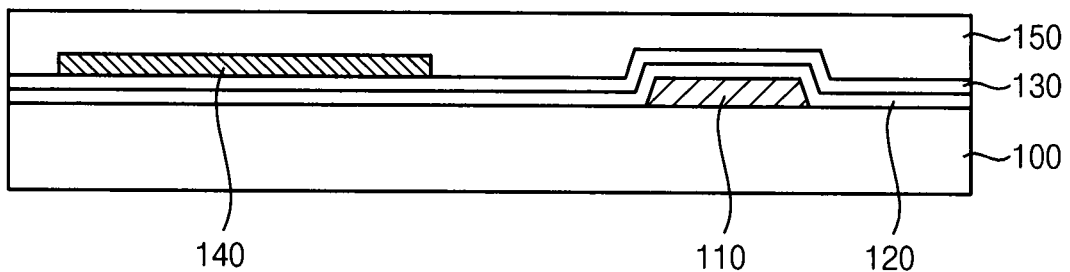

Referring to FIG. 6, a gate insulation layer 150 covering the active layer 140 may be disposed on the second buffer layer 130. The gate insulation layer 150 may sufficiently cover the active layer 140 and the stepped portion of the second buffer layer 130 to have a substantially even or leveled upper surface.

In exemplary embodiments, the gate insulation layer 150 may be provided using a material substantially the same as or similar to that of the second buffer layer 130. In an exemplary embodiment, the gate insulation layer 150 may be provided using silicon oxide by a CVD process, a PECVD process, an HDP-CVD process, a thermal deposition process, a spin-coating process, etc.

Figure 7:
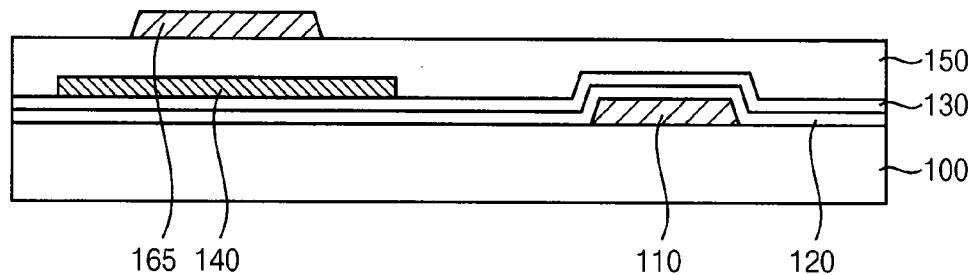

Referring to FIG. 7, a gate electrode 165 may be disposed on the gate insulation layer 150.

In exemplary embodiments, a gate electrode layer may be disposed on the gate insulation layer 150 and a photoresist pattern (not illustrated) may be disposed on the gate insulation layer. The gate electrode layer may be partially removed by a dry etching process using the photoresist pattern as an etching mask to provide the gate electrode 165. The gate electrode 165 may have a substantially trapezoidal cross-section as illustrated in FIG. 7. However, the invention is not limited thereto, and the gate electrode 165 may have a substantially rectangular cross-section.

The gate electrode 165 may diverge from a gate line of the display substrate. In this case, the gate line and the gate electrode 165 may be provided by the same etching process using the gate electrode layer.

In an exemplary embodiment, the gate electrode layer may be provided using a metal such as Al, Ag, W, Cu, Ni, Cr, Mo, Ti, Pt, Ta, Nd and Sc, a nitride thereof or an alloy thereof, for example. The above described elements may be used alone or in any combinations thereof. The gate electrode layer may be provided as a multi-layered structure including, e.g., Al/Mo layers or Ti/Cu layers. In an exemplary embodiment, the gate electrode layer may be obtained by, e.g., a sputtering process, an ALD process, a PLD process, etc.

In an exemplary embodiment, the photoresist pattern may be removed by an ashing process and/or a strip process, for example, after a formation of the gate electrode 165.

Figure 8:
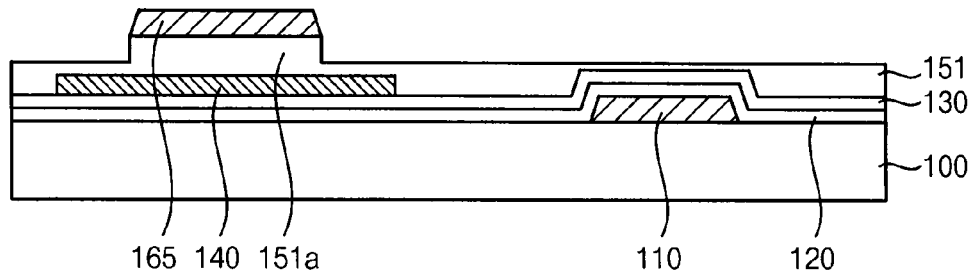

Referring to FIG. 8, the gate insulation layer 150 may be partially removed to provide a preliminary gate insulation layer pattern 151.

The preliminary gate insulation layer pattern 151 may be obtained by a first etching process using the gate electrode 165 as an etching mask. The first etching process may be performed under a condition capable of preventing a modification of the gate electrode 165 and an attachment of an etching residue. In exemplary embodiments, the first etching process may include a dry etching process using nitrogen fluoride or ammonium fluoride as an etching gas in an oxygen atmosphere, for example.

In exemplary embodiments, the preliminary gate insulation layer 151 may entirely cover the active layer 140 and at least partially cover the second buffer layer 130. The preliminary gate insulation layer pattern 151 may include a protrusion 151*a* in contact with the gate electrode 165.

Figure 9:
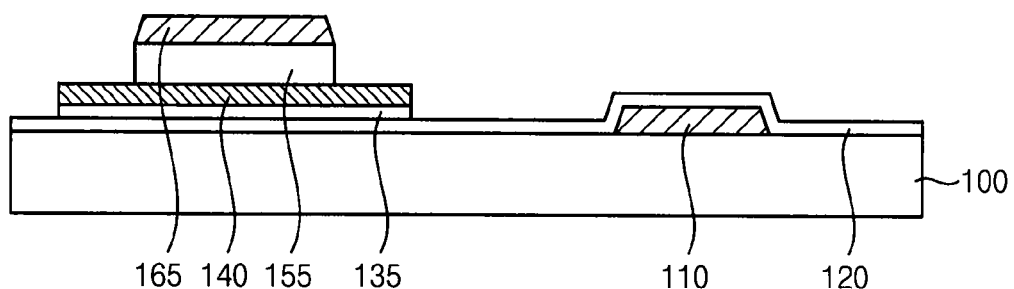

Referring to FIG. 9, the preliminary gate insulation layer pattern 151 may be partially removed to provide a gate insulation layer pattern 155, and the second buffer layer 130 may also be partially removed to provide a second buffer layer pattern 135.

In exemplary embodiments, the gate insulation layer pattern 155 may be obtained by a second etching process using the gate electrode 165 and the protrusion 151*a* as an etching mask. Accordingly, a portion of the gate insulation layer 150 substantially not overlapping with the gate electrode 165 may be removed by the second etching process. The active layer 140 and the second buffer layer 130 may be exposed by the formation of the second gate insulation layer pattern portion 155. The second buffer layer 130 may include silicon oxide substantially the same as or similar to that included in the gate insulation layer 150, so that a portion of the second buffer layer 130 substantially not covered by the active layer 140 may also be removed during a progression of the second etching process.

In exemplary embodiments, the active layer 140 may substantially serve as an etching mask for etching the second buffer layer 130. Thus, the active layer 140 and the second buffer layer pattern 135 may share a substantially common etching surface. A portion of the second buffer layer 130 covering the data pad 110 may be removed.

The second etching process may be performed under a condition capable of preventing a modification of the active layer 140 and achieving a great etching selectivity for the second buffer layer 130 relative to the first buffer layer 120. In exemplary embodiments, the second etching process may include a dry etching process using an inert gas as a carrier gas and using a carbon fluoride as an etching gas. In an exemplary embodiment, the second etching process may be performed using octafluorocyclobutane ($C_4F_8$) as the etching gas in an argon (Ar) atmosphere, for example.

In exemplary embodiments, an etching rate of the second etching process may be lower than that of the first etching process. In the first etching process, the gate insulation layer 150 may be solely etched such that the active layer 140 may not be exposed. Thus, a bulky amount of the gate insulation layer 150 may be etched with the relatively high etching rate. In the second etching process, an etching condition may be adjusted so as to suppress an etching damage of the active layer 140 and achieve the sufficient etching selectivity for the second buffer layer 130. Therefore, the etching rate of the second etching process may be controlled to be lower than that of the first etching process.

Figure 10:
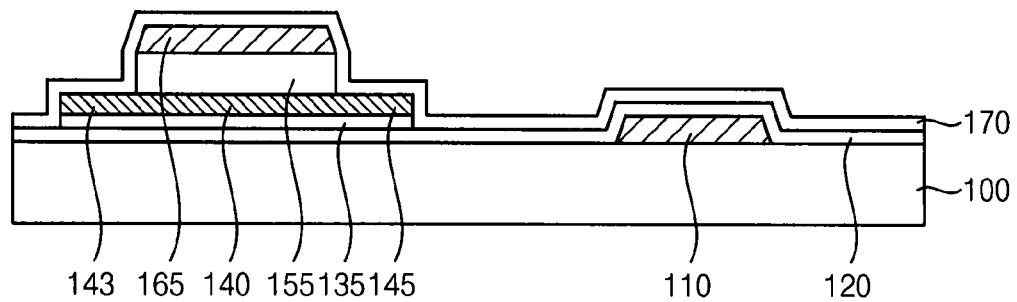

Referring to FIG. 10, a passivation layer 170 may be disposed on the base substrate 100 to cover the first buffer layer 120, the second buffer layer pattern 135, the active layer 140, the gate insulation layer pattern 155 and the gate electrode 165. In an exemplary embodiment, the passivation layer 170 may have a thin thickness to conformably cover the structures disposed on the base substrate 100. In exemplary embodiments, the passivation layer 170 may be provided using silicon nitride by, e.g., a CVD process, a PECVD process, an HDP-CVD process, a thermal deposition process or a spin-coating process, for example.

As illustrated in FIG. 10, the passivation layer 170 including silicon nitride may contact both ends of the active layer 140 exposed by the gate insulation layer pattern 155. In the case that the active layer 140 includes the oxide semiconductor, oxygen atoms or oxygen ions may be diffused into the passivation layer 170. Thus, portions of the active layer 140 in contact with the passivation layer 170 may have a reduced resistance to be transformed into a source region 143 and a drain region 145. A portion of the active layer 140 between the source region 143 and the drain region 145 may serve as a channel region providing a transferring path of charges or ions.

In the case that the active layer 140 includes polysilicon or amorphous silicon, p-type or n-type impurities may be implanted into the both ends of the active layer 140 prior to providing the passivation layer 170 such that the source region 143 and the drain region 145 may be provided.

Figure 11:
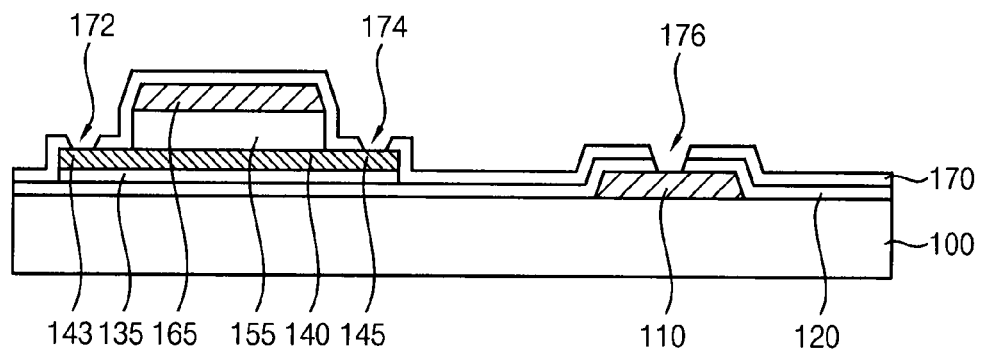

Referring to FIG. 11, the passivation layer 170 may be partially removed to define a first contact hole 172, a second contact hole 174 and a third contact hole 176 exposing top surfaces of the source region 143, the drain region 145 and the data pad 110, respectively.

In exemplary embodiments, the first to third contact holes 172, 174 and 176 may be defined simultaneously by the same etching process. In an exemplary embodiment, the etching process may include a dry etching process using ammonium fluoride or nitrogen fluoride as an etching gas, for example.

As described in FIGS. 8 and 9, the portion of the second buffer layer 130 disposed on the data pad 110 may be removed before defining the third contact hole 176. Thus, an etching time or an etching amount for defining the third contact hole 176 may be reduced. Therefore, while the first and second contact holes 172 and 174 are defined together with the third contact hole 176, an etching damage of the active layer 140 exposed by the first and second contact holes 172 and 174 may be minimized.

In an exemplary embodiment, the passivation layer 170 and the first buffer layer 120 may include the same material, e.g., silicon nitride. Thus, in the exemplary embodiment, the first to third contact holes 172, 174 and 176 may be defined by a single etching process having an etching selectivity for silicon nitride.

Figure 12:
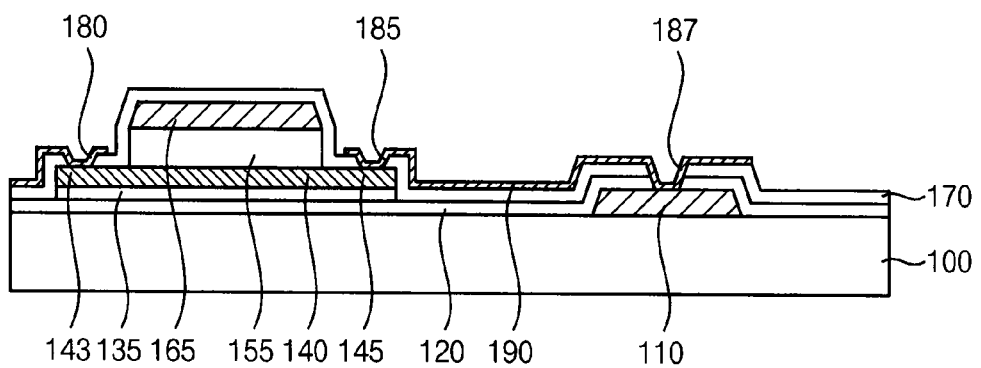

Referring to FIG. 12, a source contact 180, a drain contact 185 and a data contact 187 may be provided. The source contact 180, the drain contact 185 and the data contact 187 may be electrically connected to the source region 143, the drain region 145 and the data pad 110 via the first contact hole 172, the second contact hole 174 and the third contact hole 176, respectively.

In exemplary embodiments, a second conductive layer at least partially filling the first to third contact holes 172, 174 and 176 and contacting the source region 143, the drain region 145 and the data pad 110 may be disposed on the passivation layer 170. In an exemplary embodiment, the second conductive layer may be provided using a metal such as Al, Ag, W, Cu, Ni, Cr, Mo, Ti, Pt, Ta, Nd and Sc, a nitride thereof or an alloy thereof, for example. The above described elements may be used alone or in any combinations thereof.

The second conductive layer may be provided as a multi-layered structure including different metal layers. In exemplary embodiments, the second conductive layer may be obtained by, e.g., a sputtering process, an ALD process or a PLD process.

In exemplary embodiments, the second conductive layer may be partially removed by a photolithography process, for example, to obtain the source contact 180, the drain contact 185 and the data contact 187. The source contact 180 and the drain contact 185 may be self-aligned with the gate insulation layer pattern 155 and the passivation layer 170 to be electrically connected to the source region 143 and the drain region 145, respectively.

In exemplary embodiments, the drain contact 185 and the data contact 187 may be connected to each other by a connection electrode 190. In this case, the connection electrode 190 may be provided from the second conductive layer and integrally provided with the drain contact 185 and the data contact 187. When the display substrate is implemented in a display device, e.g., an OLED device, the connection electrode 190 may serve as a pixel electrode of the display device.

The source contact 180 may diverge from a source line or a data line of the display substrate. In this case, the source line or the data line may be provided from the second conductive layer and integrally provided with the source contact 180.

FIGS. 13 to 18 are cross-sectional views illustrating a method of manufacturing a display substrate in accordance with exemplary embodiments. FIGS. 13 to 18 illustrate exemplary embodiments of a method of manufacturing the display substrate of FIG. 2.

Detailed descriptions on processes and/or materials substantially the same as or similar to those illustrated with reference to FIGS. 3 to 12 are omitted. Further, like reference numerals are used to indicate like elements.

Figure 13:
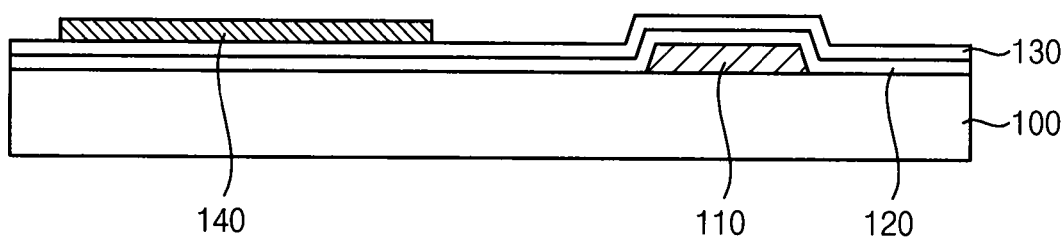

Referring to FIG. 13, processes substantially the same as or similar to those illustrated with reference to FIGS. 3 to 5 may be performed. Accordingly, a data pad 110, a first buffer layer 120, a second buffer layer 130 and an active layer 140 may be sequentially disposed on a base substrate 100.

Figure 14:
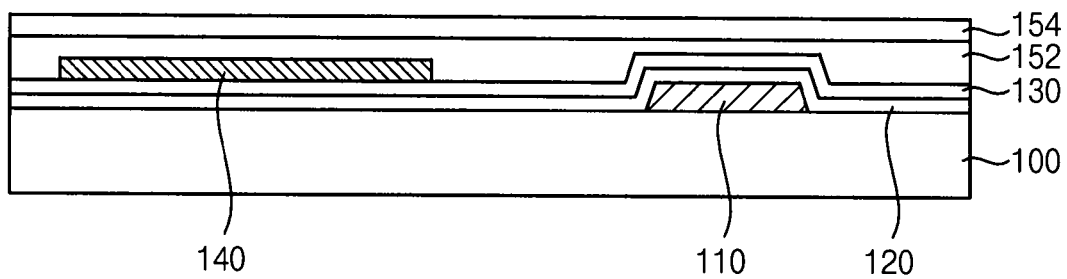

Referring to FIG. 14, a first gate insulation layer 152 and a second gate insulation layer 154 may be sequentially disposed on the second buffer layer 130 to cover the active layer 140.

In exemplary embodiments, the first gate insulation layer 152 may be provided using silicon oxide, and the second gate insulation layer 154 may be provided using silicon nitride, for example.

Figure 15:
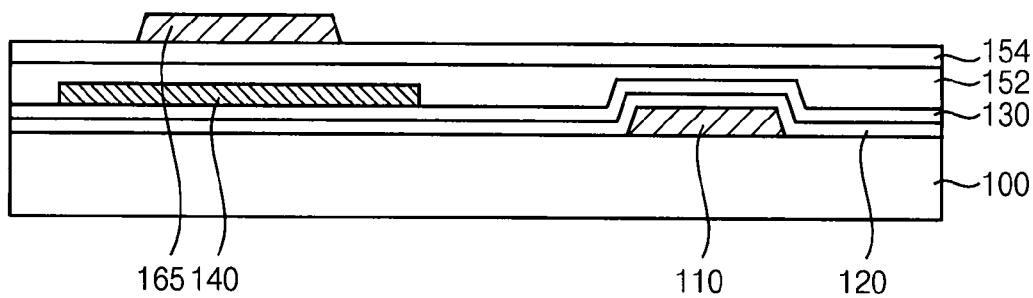

Referring to FIG. 15, a process substantially the same as or similar to that illustrated with reference to FIG. 7 may be performed to dispose a gate electrode 165 on the second gate insulation layer 154.

Figure 16:
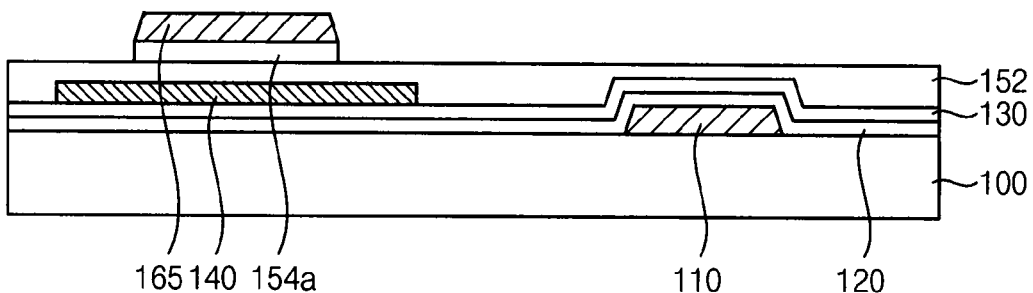

Referring to FIGS. 15 and 16, the second gate insulation layer 154 may be etched to provide a second gate insulation layer pattern portion 154*a*.

In exemplary embodiments, a first etching process using the gate electrode 165 as an etching mask may be performed on the second gate insulation layer 154 to obtain the second gate insulation layer pattern portion 154*a*. In an exemplary embodiment, the first etching process may include a dry etching process in which nitrogen fluoride and/or ammonium fluoride may be used as an etching gas and oxygen may be used as a carrier gas. In one exemplary embodiment, the first etching process may include a wet etching process in which an etching solution having a great etching selectivity for silicon nitride is used. In an exemplary embodiment, the etching solution may include phosphoric acid or sulfuric acid, for example.

A portion of the second gate insulation layer 154 substantially not overlapping with the gate electrode 165 may be removed by the first etching process. The first gate insulation layer 152 may serve substantially as an etch-stopper in the first etching process. Thus, an end-point of the first etching process may be easily determined.

In one exemplary embodiment, an upper portion of the first gate insulation layer 152 may be slightly etched such that the active layer 140 may not be exposed.

Figure 17:
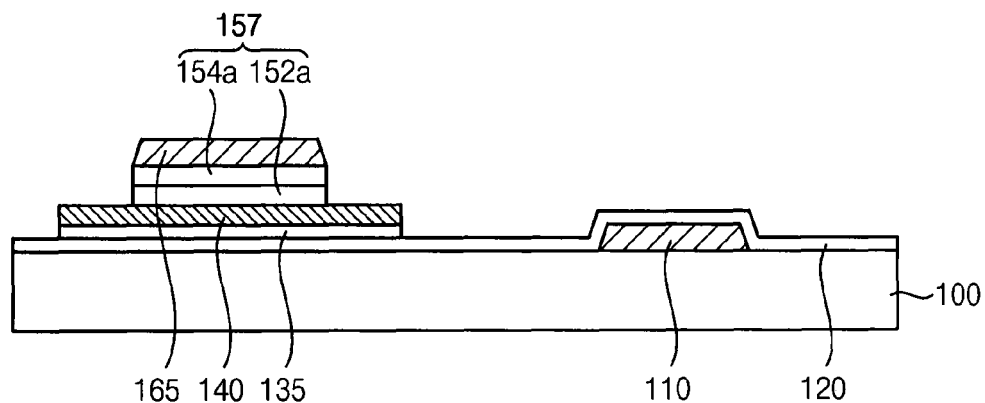

Referring to FIG. 17, a process substantially the same as or similar to that illustrated with reference to FIG. 9 may be performed to provide a first gate insulation layer pattern portion 152*a* and a second buffer layer pattern 135.

In exemplary embodiments, a second etching process substantially the same as or similar to that illustrated with reference to FIG. 9 may be performed using the gate electrode 165 and the second gate insulation layer pattern portion 154*a* as an etching mask. Accordingly, the first gate insulation layer 152 (refer to FIG. 16) may be etched to provide the first gate insulation layer pattern portion 152*a*, and a portion of the second buffer layer 130 substantially not covered by the active layer 140 may also be etched to provide the second buffer layer pattern 135. The second etching process may be performed at an etching rate lower than that of the first etching process described in FIG. 16.

By performing the second etching process as described above, a gate insulation layer pattern 157 including the first and second gate insulation layer pattern portions 152*a* and 154*a* may be obtained.

Figure 18:
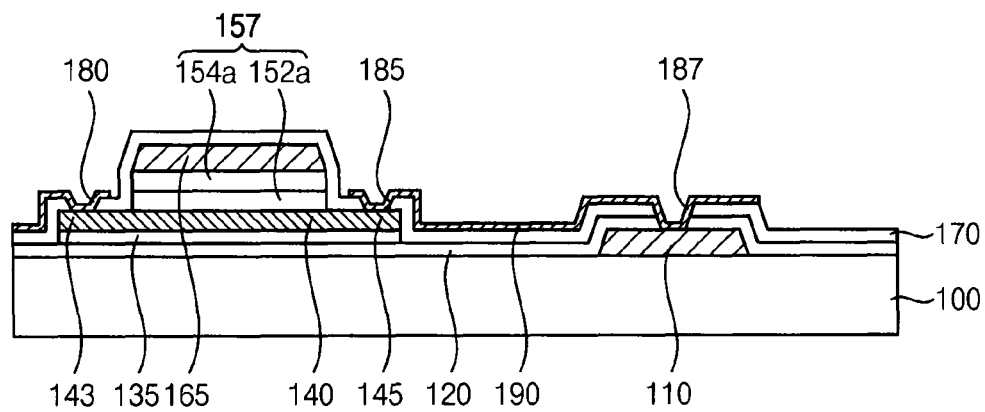

Referring to FIG. 18, processes substantially the same as or similar to those illustrated with reference to FIGS. 10 to 12 may be performed.

Accordingly, a passivation layer 170 covering the second buffer layer pattern 135, the active layer 140, the gate insulation layer pattern 157 and gate electrode 165 may be disposed on the first buffer layer 120. Both ends of the active layer 140 may be transformed into a source region 143 and a drain region 145. A source contact 180, a drain contact 185 and a data contact 187 electrically connected to the source region 143, the drain region 145 and the data pad 110 may be defined through the passivation layer 170. A connection electrode 190 connecting the drain contact 185 and the data contact 187 to each other may be provided.

Figure 19:
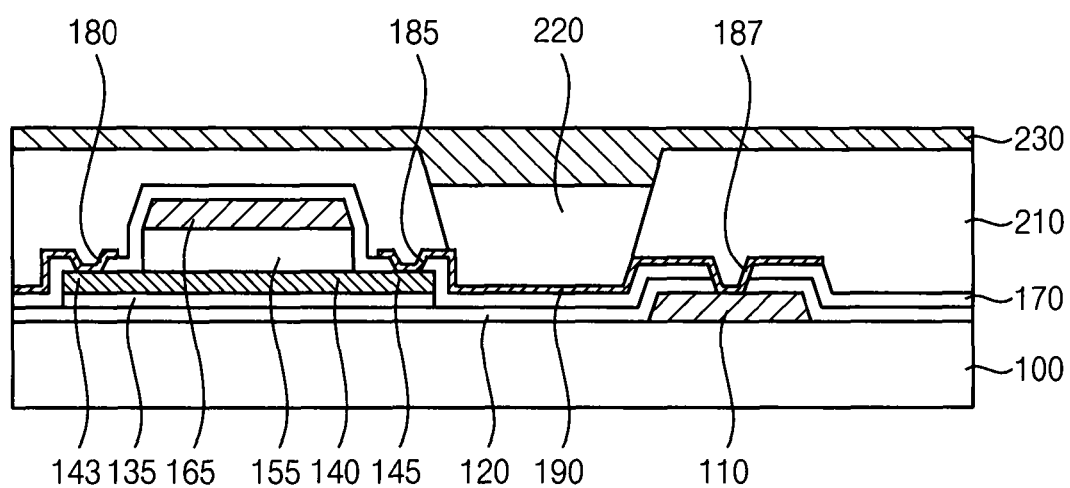

FIG. 19 is a cross-sectional view illustrating a display device in accordance with exemplary embodiments. In an exemplary embodiment, FIG. 19 illustrates an OLED device employing the display substrate illustrated in FIG. 1. However, the invention is not limited thereto, and the display substrate may be implemented in other display devices, e.g., a liquid crystal display ("LCD") device, a flexible display device, a flat-panel display device, etc. The display device may also employ the display substrate illustrated in FIG. 2.

Detailed descriptions on elements and/or structures substantially the same as or similar to those illustrated with reference to FIGS. 1 and 2 are omitted, and like reference numerals are used to indicate like elements. Methods of manufacturing the display substrate are also described with reference to FIG. 19.

Referring to FIG. 19, the display device may include the display substrate illustrated in FIG. 1 and a light emitting structure disposed on the display substrate.

The display substrate may include a data pad 110, a first buffer layer 120, a second buffer layer pattern 135, an active layer 140 including a source region 143 and a drain region 145 at both ends thereof, a gate insulation layer pattern 155, a gate electrode 165, a passivation layer 170, a source contact 180, a drain contact 185, a data contact 187 and a connection electrode 190 on a base substrate 100 as described in FIG. 1. The connection electrode 190 may serve as a pixel electrode of the display device. A TFT of the display substrate may be defined by the active layer 140, the gate insulation layer pattern 155 and the gate electrode 165.

The light emitting structure may include a pixel defining layer ("PDL") 210, a light emitting layer ("EML") 220 and an opposing electrode 230.

The PDL 210 may cover the display substrate and at least partially expose the connection electrode 190. The PDL 210 may define a pixel region of the display device. An area of the connection electrode 190 not covered by the PDL 210 may substantially correspond to the pixel region. In an exemplary embodiment, a photosensitive material layer may be disposed on the display substrate using an organic photosensitive material including polyimide an acryl-based resin or benzocyclobutene ("BCB"), for example, and then an exposure process and a developing process may be performed on the photosensitive material layer to provide the PDL 210.

The EML 220 may be disposed on the connection electrode 190 exposed by the PDL 210. In exemplary embodiments, a hole transport layer ("HTL") may be further provided between the connection electrode 190 and the EML 220. The connection electrode 190 may serve as an anode providing holes into the EML 220.

The EML 220 may be provided using at least one of light emitting materials for generating different colors of light, for example, a red color of light, a green color of light or a blue color of light. In one exemplary embodiment, the EML 220 may be provided using any combinations of the light emitting materials for generating a white color of light.

The HTL may be provided using a hole transport material, e.g., 4,4'-bis[N-(1-naphtyl)-N-phenylamino]biphenyl ("NPB"), 4,4'-bis[N-(3-methylphenyl)-N-phenylamino]biphenyl ("TPD"), N,N'-di-1-naphtyl-N,N'-diphenyl-1,1'-biphenyl-4,4'-diamine ("NPD"), N-phenylcarbazole, polyvinylcarbazole or any combinations thereof. In exemplary embodiments, the EML 220 and the HTL may be provided by a spin coating process, a roll printing process, a nozzle printing process, an inkjet printing process, a transfer process using a donor substrate, etc.

As illustrated in FIG. 19, the EML 220 may be confined by sidewalls of the PDL 210. In one exemplary embodiment, the EML 220 may be provided continuously along surfaces of the PDL 210 and the connection electrode 190.

The opposing electrode 230 facing the connection electrode 190 may be disposed on the EML 220. The opposing electrode 230 may serve as a cathode providing electrons into the EML 220. The opposing electrode 230 may be provided using lithium (Li), calcium (Ca), lithium fluoride/Ca (LiF/

Ca), lithium fluoride/aluminum (LiF/Al), a metal such as Al, Mg, Ag, Cr, W, Mo or Ti, or an alloy of the metal. In an alternative exemplary embodiment, the opposing electrode 230 may be provided using a transparent conductive material, e.g., ITO, IZO, ZTO, zinc oxide, tin oxide, etc. The opposing electrode 230 may have a multi-layered structure including a metal layer and a transparent conductive material layer. The opposing electrode 230 may be obtained by a sputtering process, a CVD process, an ALD process, a vacuum evaporation process, a printing process, etc.

The opposing electrode 230 may be disposed on a substantially entire surface of the display device to serve as a common electrode. In an alternative exemplary embodiment, the opposing electrode 230 may be patterned in each pixel region. In this case, the opposing electrode may be confined by the sidewalls of the PDL 210 together with the EML 220.

In an exemplary embodiment, an electron transport layer ("ETL") may be further provided between the EML 220 and the opposing electrode 230. The ETL may be provided using an electron transport material, e.g., tris(8-quinolinolato)aluminum (Alq3), 2-(4-biphenylyl)-5-4-tert-butylphenyl-1,3,4-oxadiazole ("PBD"), bis(2-methyl-8-quinolinolato)-4-phenylphenolato-aluminum (BAlq), bathocuproine ("BCP") or any combinations thereof. The ETL may be obtained by a spin coating process, a roll printing process, a nozzle printing process, an inkjet printing process, a transfer process using a donor substrate, etc.

In exemplary embodiments, an additional layer structure including, e.g., a light scattering layer and/or a polarization layer may be further disposed on the opposing electrode 230 to improve a light extraction efficiency of the display device. Additionally, an encapsulation member at least partially cover the display device may be provided so that the display device may be protected from an external environment including moistures and/or oxygen.

Experimental Example

Evaluation on Damages of an Active Layer

Example

A display substrate was manufactured by performing processes substantially the same as or similar to those illustrated with reference to FIGS. 3 to 10. Specifically, a data pad 110 was disposed on a base substrate 100, and then a first buffer layer 120 and a second buffer layer 130 covering the data pad 110 were provided using silicon nitride and silicon oxide, respectively. Thicknesses of the first buffer layer 120 and the second buffer layer 130 were 1000 angstrom (Å) and 500 Å, respectively. An active layer 140 was disposed on the second buffer layer 130 using IGZO. A thickness of the active layer was 500 Å.

A gate insulation layer 150 having a thickness of 2000 Å was disposed on the second buffer layer 130 using silicon oxide. A gate electrode 165 having a double-layered structure of Ti/Cu layers was disposed on the gate insulation layer 150. A thickness of the gate electrode 165 was 3000 Å. A first etching process was performed to partially etch the gate insulation layer 150 by an amount of 1500 Å. Accordingly, a preliminary gate insulation layer pattern 151 was obtained. The first etching process was carried out in an oxygen ($O_2$) atmosphere using $NF_3$ as an etching gas.

A second etching process was performed to provide a gate insulation layer pattern 155 and etch a portion of the second buffer layer 130 not covered by the active layer 140. Accordingly, a second buffer layer pattern 135 was obtained under the active layer 140. The second etching process was carried out in an argon atmosphere using $C_4F_8$ as an etching gas. An amount of an etching damage on the active layer 140 was measured while performing the second etching process.

A passivation layer 170 having a thickness of 1000 Å was disposed on the active layer 140, the gate insulation layer pattern 155, the gate electrode 165 and the first buffer layer 120 using silicon nitride. A portion of the passivation layer 170 covering the active layer 140 and portions of the first buffer layer 120 and the passivation layer 170 covering the data pad 110 were etched simultaneously to define a second contact hole 174 and a third contact hole 176. An additional amount of an etching damage on the active layer 140 was measured during the etching process for defining the second contact hole 174.

Comparative Example

In conditions substantially the same as those of the above Example, a data pad 110, a first buffer layer 120, a second buffer layer 130, an active layer 140, a gate insulation layer 150 and a gate electrode 165 were disposed on the base substrate 100. Each thickness of the second buffer layer 130 and the gate insulation layer 150 was 1000 Å.

The gate insulation layer 150 was etched using the gate electrode 165 as an etching mask by a single-step etching process to provide a gate insulation layer pattern 155. Thus, the active layer 140 was exposed. The second buffer layer 130 was not etched, and thus the data pad 110 was covered by the second buffer layer 130 even after the etching process. The etching process was carried out in an oxygen atmosphere using $CF_4$ as an etching gas. An amount of an etching damage on the active layer 140 was measured while performing the etching process.

A passivation layer 170 having a thickness of 1000 Å was disposed on the active layer 140, the gate insulation layer pattern 155, the gate electrode 165 and the second buffer layer 130 using silicon nitride. A portion of the passivation layer 170 covering the active layer 140 and portions of the first buffer layer 120, the second buffer layer 130 and the passivation layer 170 covering the data pad 110 were etched simultaneously to define a second contact hole 174 and a third contact hole 176. The etching process was carried out in an atmosphere of oxygen and argon using $NF_3$ as an etching gas. An additional amount of an etching damage on the active layer 140 was measured while defining the second contact hole 174.

The amounts of the etching damages measured in the above Example and Comparative Example are shown in Table 1 below.

TABLE 1

| | Total Etching Amount | Etching Damages of the active layer |
|---|---|---|
| Example | 3500 Å | The first etching process: No Damages<br>The second etching process: 40 Å<br>The etching process for the second contact hole: 55 Å |
| Comparative Example | 3000 Å | The etching process for the gate insulation layer pattern: 10 Å<br>The etching process for the second contact hole: 413 Å |

As shown in Table 1, even though the total etching amount (the total removed thickness of the gate insulation layer, the first buffer layer and the second buffer layer) of Example was greater than that of Comparative Example, the total etching damage of Example (i.e., 95 Å) was much less than that of Comparative Example (i.e., 423 Å).

According to exemplary embodiments, the gate insulation layer pattern 155 may be provided by, e.g., two etching process, and a portion of the second buffer layer 130 covering the data pad 110 may be removed before defining a contact hole that may expose the data pad 110. Thus, an etching amount used to define the contact hole may be decreased so that an etching damage of the active layer 140 may be drastically reduced.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display substrate, comprising:
    a data pad on a base substrate;
    a first buffer layer which covers the data pad;
    a second buffer layer pattern which is disposed on the first buffer layer and separated from the data pad in a plan view;
    an active layer on the second buffer layer pattern;
    a gate insulation layer pattern on the active layer, both ends of the active layer exposed by the gate insulation layer pattern; and
    a gate electrode on the gate insulation layer pattern.

2. The display substrate of claim 1, wherein the first buffer layer includes silicon nitride and the second buffer layer pattern includes silicon oxide.

3. The display substrate of claim 2, wherein the gate insulation layer pattern includes silicon oxide.

4. The display substrate of claim 2, wherein the gate insulation layer pattern includes:
    a first gate insulation layer pattern portion including silicon oxide; and
    a second gate insulation layer pattern portion including silicon nitride on the first gate insulation layer pattern portion.

5. The display substrate of claim 1, wherein lateral surfaces of the active layer and the second buffer layer pattern are extended in the same plane.

6. The display substrate of claim 1, further comprising:
    a passivation layer which covers the first buffer layer, the second buffer layer pattern, the active layer, the gate insulation layer pattern and the gate electrode;
    a drain contact extended through the passivation layer to be electrically connected to one end of the active layer; and
    a data contact extended through the passivation layer and the first buffer layer to be electrically connected to the data pad.

7. The display substrate of claim 6, further comprising a connection electrode which is unitary with the drain contact and the data contact.

* * * * *